(12) United States Patent
Circello et al.

(10) Patent No.: US 10,210,040 B2
(45) Date of Patent: Feb. 19, 2019

(54) MULTI-DIMENSIONAL PARITY CHECKER (MDPC) SYSTEMS AND RELATED METHODS FOR EXTERNAL MEMORIES

(71) Applicant: Freescale Semiconductor, Inc., Austin, TX (US)

(72) Inventors: Joseph C. Circello, Phoenix, AZ (US); David J. Schimke, Phoenix, AZ (US)

(73) Assignee: NXP USA, Inc., Austin, TX (US)

(*) Notice: Subject to any disclaimer, the term of this patent is extended or adjusted under 35 U.S.C. 154(b) by 231 days.

(21) Appl. No.: 15/008,973

(22) Filed: Jan. 28, 2016

(65) Prior Publication Data
US 2017/0220414 A1     Aug. 3, 2017

(51) Int. Cl.
*G06F 11/10* (2006.01)
*H03M 13/15* (2006.01)
*G11C 29/52* (2006.01)

(52) U.S. Cl.
CPC ..... *G06F 11/1068* (2013.01); *H03M 13/1575* (2013.01); *G11C 29/52* (2013.01)

(58) Field of Classification Search
None
See application file for complete search history.

(56) References Cited

U.S. PATENT DOCUMENTS

| | | |
|---|---|---|
| 3,183,483 A | 5/1965 | Lisowski |
| 4,183,463 A | 1/1980 | Kemmetmueller |
| 5,381,480 A | 1/1995 | Butter et al. |
| 7,380,200 B2 * | 5/2008 | Dent .................. G06F 11/1048 714/805 |
| 7,505,598 B2 | 3/2009 | Baer et al. |
| 7,702,100 B2 | 4/2010 | Han et al. |
| 8,051,300 B2 | 11/2011 | Cherian et al. |

(Continued)

FOREIGN PATENT DOCUMENTS

| | | |
|---|---|---|
| EP | 1679632 A2 | 7/2006 |
| WO | 2009029842 | 3/2009 |

OTHER PUBLICATIONS

Schaad et al., "Advanced Encryption Standard (AES) Key Wrap Algorithm", Sep. 2002, 39 pgs.

(Continued)

*Primary Examiner* — Justin R Knapp

(57) ABSTRACT

Multi-dimensional parity checker (MDPC) systems and related methods are disclosed to check parity of data regions within external memories. In one embodiment, the MDPC system includes a control register and a parity checker. The parity checker receives data segments accessed from the data region. The parity checker generates and accumulates multi-dimensional parity bits for the data segments and subsequently compares accumulated bits to expected multi-dimensional parity bits to generate multi-dimensional error syndrome bits representing identified comparison errors. The parity checker also determines a syndrome state based upon the multi-dimensional syndrome bits and stores the syndrome state within the control register. The parity checker operates in different modes based upon different values stored in an operational mode field of the control register. The parity checker can operate in a real-time error correction mode to correct errors within the data region from subsequent random accesses by components within the integrated circuit.

17 Claims, 7 Drawing Sheets

(56) References Cited

U.S. PATENT DOCUMENTS

| | | | |
|---|---|---|---|
| 8,175,276 B2 | 5/2012 | Tkacik et al. | |
| 8,316,284 B2 * | 11/2012 | O'Neill | G06F 11/10 |
| | | | 714/769 |
| 8,464,095 B1 * | 6/2013 | Bonwick | G06F 11/1088 |
| | | | 714/6.2 |
| 8,832,523 B2 * | 9/2014 | Lablans | G06F 11/1072 |
| | | | 714/755 |
| 9,450,609 B1 * | 9/2016 | Schmit | H03M 13/05 |
| 2001/0018736 A1 | 8/2001 | Hashimoto et al. | |
| 2004/0015707 A1 | 1/2004 | Lee | |
| 2005/0190919 A1 | 9/2005 | Baer et al. | |
| 2006/0026417 A1 | 2/2006 | Furusawa et al. | |
| 2009/0060197 A1 | 3/2009 | Taylor et al. | |
| 2009/0259855 A1 | 10/2009 | De Cesare et al. | |
| 2011/0158403 A1 | 6/2011 | Mathew et al. | |

OTHER PUBLICATIONS

Premier Minstre, "Protection Profile-On-The-Fly Mass Storage Encryption Application", Aug. 2008, 43 pgs.
Wikipedia, "Multidimensional Parity-Check Code", Dec. 2012, 2 pgs.
Federal Information, Processing Standards Publication 197, Advanced Encryption Standard (AES), Nov. 26, 2001, 47 pgs.
Dworkin, "Recommendation for Block Cipher Modes of Operation", NIST Special Publication 800-38A, 2001, 59 pgs.
Cicello et al., "Key Management for On-The-Fly Hardware Decryption Within Integrated Circuits", U.S. Appl. No. 14/570,611, filed Dec. 15, 2014, 23 pgs.
Circello et al. "Decryption Systems and Related Methods for On-The-Fly Decryption Within Integrated Circuits", U.S. Appl. No. 14/570,706, filed Dec. 15, 2014, 27 pgs.

\* cited by examiner

MULTI-DIMENSIONAL PARITY CHECKER (MDPC) SYSTEMS AND RELATED METHODS FOR EXTERNAL MEMORIES

TECHNICAL FIELD

This technical field relates to multi-dimensional parity checkers and, more particularly, to parity checker systems for data, such as software code images, stored in external memories.

BACKGROUND

It is often desirable to provide software code or other data that is loaded from external memories and executed or otherwise accessed by processing circuitry embedded within integrated circuits. For certain environments including such embedded processors, hardware data integrity mechanisms are desirable for the data stored within the external, off-chip memories. Traditional error correcting codes (ECC) can be used for implementations needing such hardware enforced data integrity measures. However, many non-volatile and/or random access (RAM) memory devices that are used for external memories have low pin count interfaces, for example, 1-bit, 2-bit, 4-bit, or 8-bit data buses, based on package pin constraints, resulting in difficulties in implementing traditional ECC mechanisms that rely upon relatively wide data paths to efficiently analyze and correct bit errors within the external memories.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

DETAILED DESCRIPTION

Figure 1A:
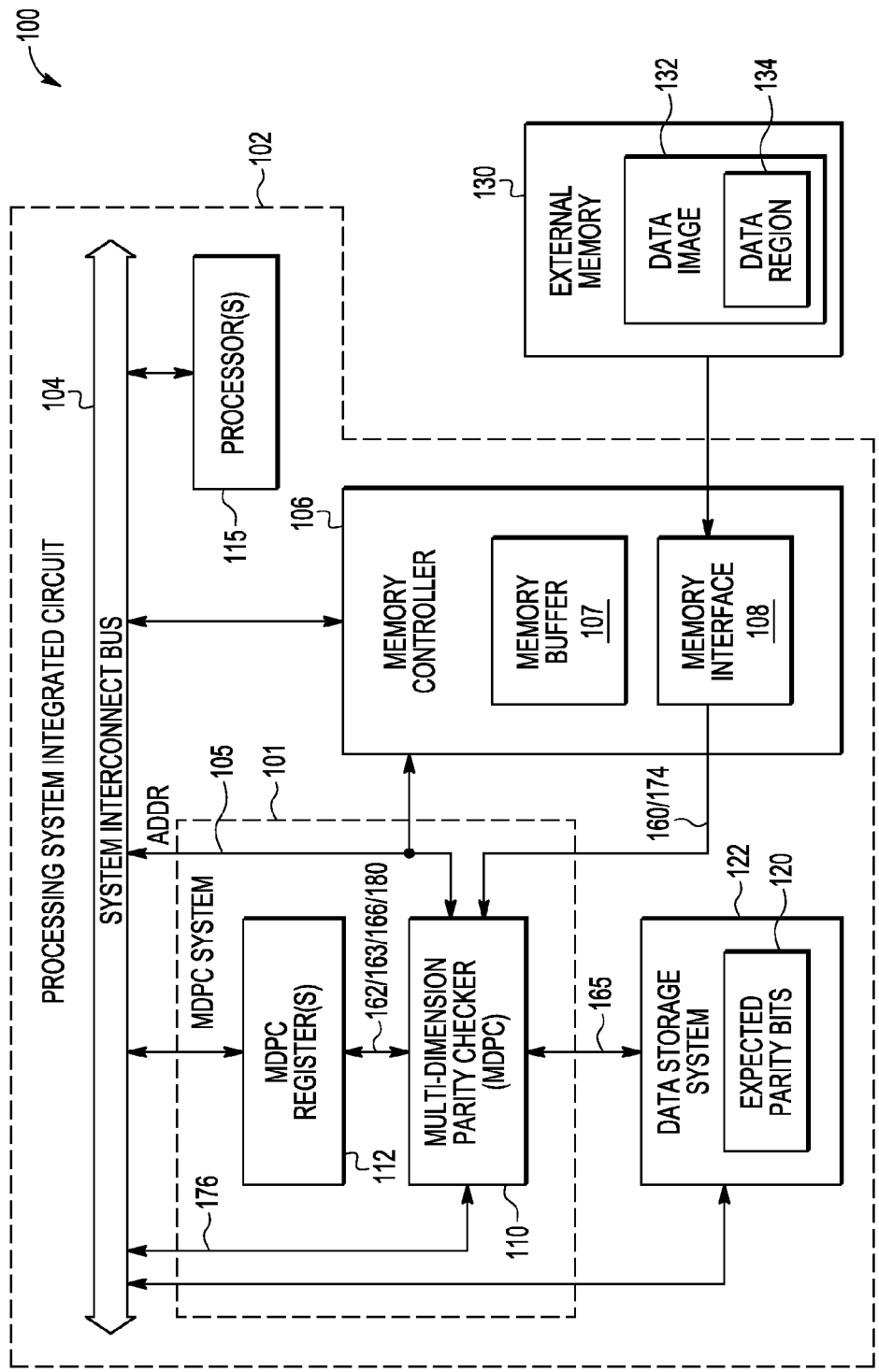
FIG. 1A is a block diagram of an example embodiment for a multi-dimensional parity checker (MDPC) for an MDPC system within a processing system integrated circuit.

Multi-dimensional parity checker (MDPC) systems and related methods are disclosed to check parity of data regions within external memories. In one embodiment, the MDPC system is within an integrated circuit that accesses an external memory including a data region that is to be parity checked. The MDPC system includes a control register and a parity checker. The control register has a field that stores a syndrome state. In operation, the parity checker receives data segments accessed from the data region within the external memory. The parity checker generates and accumulates multi-dimensional parity bits for the data segments and compares the accumulated multi-dimensional parity bits to expected multi-dimensional parity bits to generate multi-dimensional error syndrome bits representing errors identified from the comparison. The parity checker also determines a syndrome state based upon the multi-dimensional syndrome bits and stores the syndrome state within the control register. The syndrome state can include a first syndrome indicating detection of no errors, a second syndrome indicating detection of correctable errors, a third syndrome indicating detection of uncorrectable errors, and/or other syndrome states. In addition, the parity checker can operate in different modes based upon different values stored in an operational mode field of the control register. Further, the parity checker can operate in a real-time error correction mode to correct errors within the data region from subsequent random accesses by components within the integrated circuit. In certain embodiments, the external memories contain encrypted software images that are accessed and decrypted within the integrated circuit. Different features and variations can be implemented, as desired, and related or modified systems and methods can be utilized, as well.

In part, the disclosed MDPC embodiments provide error detection and correction for hard permanent faults within variably-sized data regions stored within external memories. For one example embodiment, the MDPC system is configured to access a variably-sized data region from external memory and provides error detection and correction capabilities for hard faults within this variably-sized data region. For certain embodiments, the data region size is allowed to vary from 8 bytes (64 bits for 8-bit bytes) to 128 kilobytes (1048576 bits (1024 bits×1024 bits) for 8-bit bytes). To identify the variably-sized data regions to be checked, a start address and an end address for the data region can be stored within on-chip data registers. For example, where a software image is stored within an external memory and then accessed by an on-chip component, decryption engine, and/or processor during operation, the start/end addresses can be used to determine which data region within the software image is to be checked by the on-chip MDPC system. In operation, the MDPC system generates accumulated multi-dimensional parity bits for this data region which are subsequently compared to expected parity bits for this data region that have been previously generated and stored based upon known good data for the external memory region. Differences identified from this comparison are then used by the MDPC system to define a syndrome state for the data region that indicates in part whether the data region has no errors, has correctable errors, or has uncorrectable errors. During later operation, the MDPC system can also be used in certain MDPC embodiments to provide real-time on-the-fly correction of data accessed within the data region. Further, this real-time correction can be part of an on-the-fly decryption engine where the data region is encrypted within the external memory. It is further noted that the MDPC systems and methods described herein apply error correcting techniques that effectively generate multi-dimensional parity bits for a multi-dimensional array of data. In general, it is further noted that an N-dimensional parity checker can typically correct N/2 errors within an N-dimensional array of data (e.g., two-dimensional parity checkers can correct one bit error within a two-dimensional array of data). The embodiments described herein, however, can also correct an odd number of bits in error in a single row, or an odd number of bits in error in a single column. Other variations can also be implemented.

FIG. 1A is a block diagram of an example embodiment 100 for an MDPC system 101, including an MDPC 110 and one or more MDPC registers 112, within a processing system integrated circuit 102. In part, the processing system integrated circuit 102 includes a memory controller 106, one or more processors 115, and a data storage system 122 in addition to the MDPC system 101. The memory controller 106 communicates with an external memory 130 to read data from a data image 132 stored within the external memory, which can be a software code image and can also be encrypted as described further below. In operation, the memory controller 106 sends data segments accessed from the data region 134 within the external memory 130 to the MDPC 110 through a memory interface 108. The MDPC 110 then performs a multi-dimensional parity check of the data region 134. In particular, the MDPC 110 generates multi-dimensional parity bits for the data region 134 and subsequently compares these parity bits with expected multi-dimensional parity bits 120 to identify comparison errors that are stored as error syndrome bits. The expected multi-dimensional parity bits 120 are parity bits that have been previously generated and stored in a data storage system 122 based upon known good data for the data region 134.

As described in more detail below, the MDPC registers 112 can be used by the MDPC 110 to accumulate row and column parity bits, to store error syndrome bits, to store start/end addresses, to store a syndrome state for the resulting parity check of the data region 134, to store an operation mode for the MDPC 110, and/or to store different or additional data. The memory buffer 107 can also be associated with the memory controller 106 and can be used to store data being processed within the system by the one or more processors 115. Addresses (ADDR) 105 can also be provided to the MDPC 110 and to the memory controller 106 with respect to data being accessed within the data image 132. The MDPC 110, the MDPC registers 112, the data storage system 122, the processors 115, and the memory controller 106 can also communicate with each other and/or with other components within the processing system integrated circuit 102 through a system interconnect bus 104, which can include one or more different communication buses and/or intervening circuit blocks. In addition, the external memory 130 can be implemented using a wide variety of memory devices, including SPI (serial port interface) flash memories where data (e.g., software image) is stored and later used for system operation. The data storage system 122 can also be implemented using a wide variety of memory devices, including on-chip flash memories and/or external memories, as desired. It is further noted that the processor(s) 115, the MDPC system 101, the memory controller 106, and/or the decryption system 412 can be implemented using one or more processing devices including controllers, microcontrollers, microprocessors, central processing units, hardware accelerators, configurable logic devices (e.g., field programmable gate arrays), and/or other processing devices. Other variations can also be implemented while still taking advantage of the multi-dimensional parity check techniques described herein.

Figure 1B:
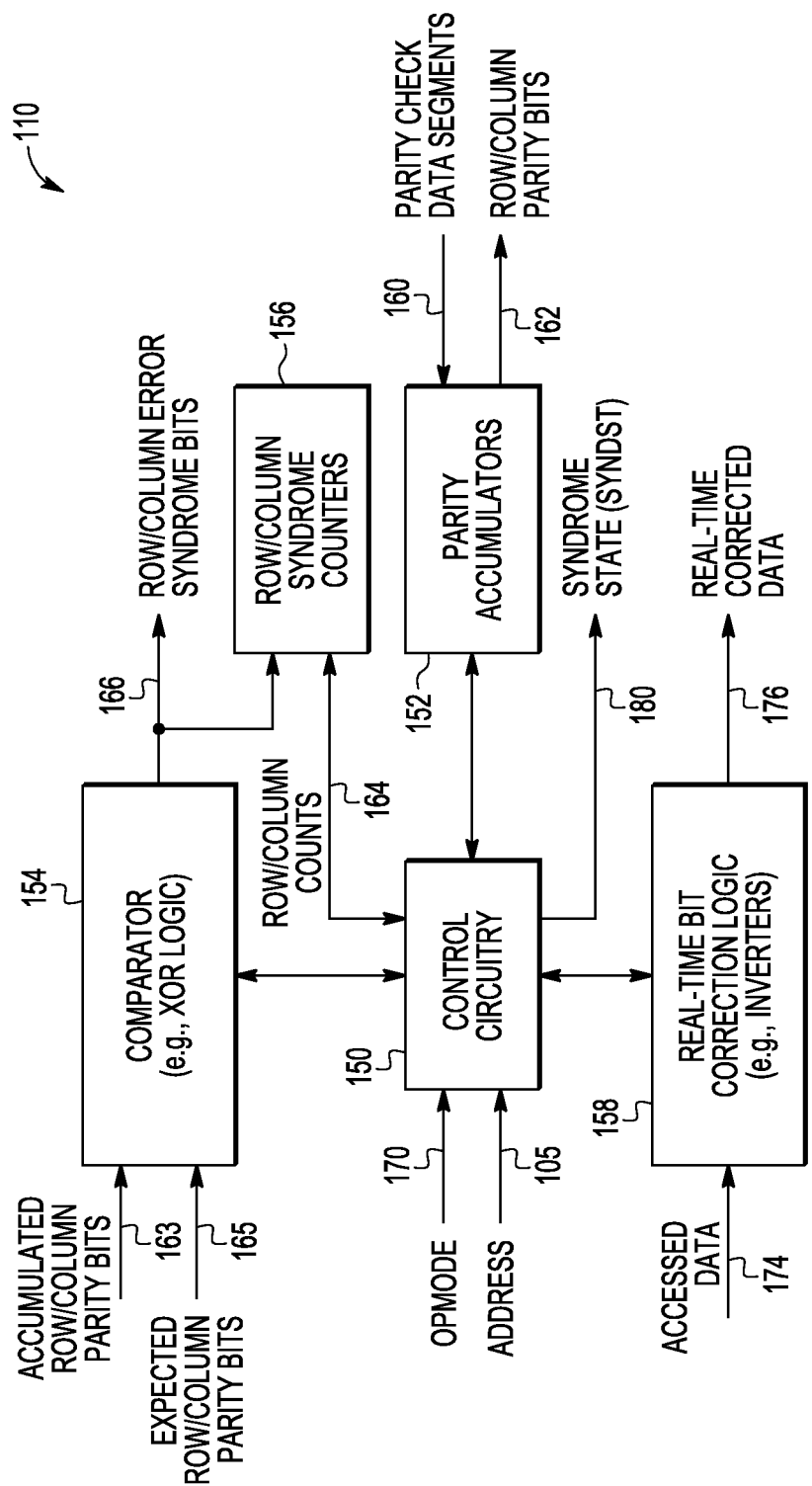
FIG. 1B is a block diagram of an example embodiment for an MDPC where a two-dimensional parity check is provided by the MDPC.

FIG. 1B is a block diagram of an example embodiment for the MDPC 110 where a two-dimensional parity check is provided by the MDPC 110. Control circuitry 150 receives an operational mode (OPMODE) 170 that determines a current mode of operation for the MDPC 110 as described in more detail below. The parity accumulators 152 operate to receive parity check data segments 160 accessed from the data region 134 and to generate and accumulate row/column parity bits 162 that are stored in the MDPC registers 112. The comparator 154 operates to compare accumulated multi-dimensional row/column parity bits 163 received from the MDPC registers 112 with expected multi-dimensional row/column parity bits 165 received from the expected parity bits 120 stored in data storage system 122. For example, XOR logic operations can be used for the comparator 154 to provide a modulo-2 inequality compare function that operates such that if two input bits have the same logic level (e.g., 00 or 11), a logic "0" is output, and if two input bits have different logic levels (e.g., 01 or 10), a logic "1" is output. The comparator 154 generates row/column error syndrome bits 166 representing identified comparison errors (e.g., where accumulated parity and expected parity bits do not match) that are stored back in the MDPC registers 112. Row/column syndrome counters 156 are also used to receive the row/column error syndrome bits 166 from the comparator 154 and/or from the MDPC registers 112 to generate row error counts and column error counts representing the number of asserted error bits in the row and column syndrome bits 166. The control circuitry 150 then uses these row/column error counts 164 from the row/column syndrome counters 156 to generate the syndrome state (SYNDST) 180 that is stored in the MDPC registers 112 as described further below. Where the syndrome state (SYNDST) 180 indicates correctable errors and the MDPC 110 is enabled for real-time error correction (e.g., OPMODE7 described below), the real-time bit correction logic 158 (e.g., inverters) receives subsequently accessed data 174 from the data region 134 and generates real-time corrected data 176 that is provided to other components within the processing system integrated circuit 102, for example, a decryption system as described further below.

Figure 2A:
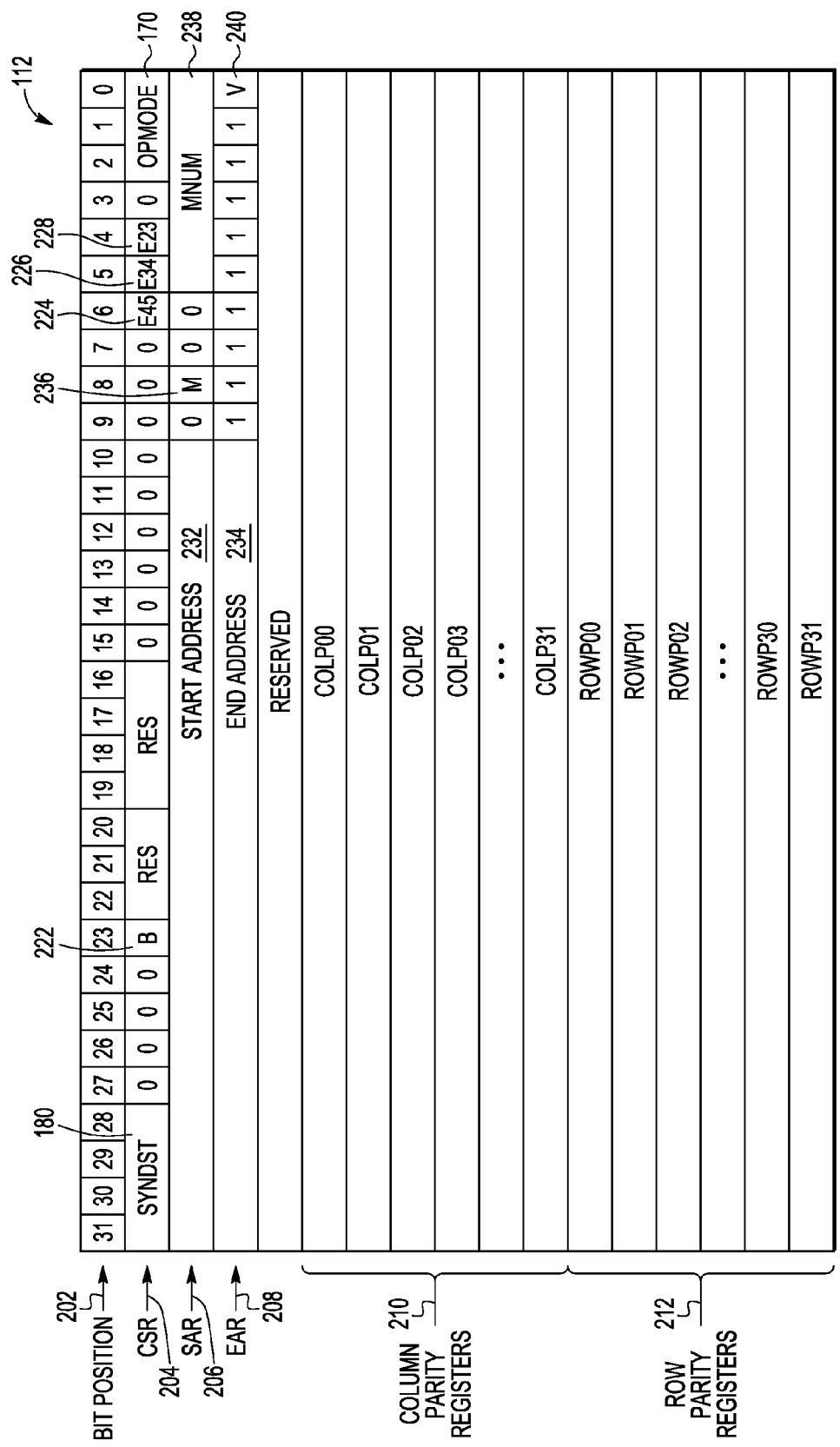
FIG. 2A is a diagram of an example embodiment for MDPC registers wherein a two-dimensional parity check is provided by the MDPC.

FIG. 2A is a diagram of an example embodiment for MDPC registers 112. For the example embodiment depicted, the MDPC registers are 32-bit registers and include a control and status register (CSR) 204, a start address register (SAR) 206, an end address register (EAR) 208, column parity (COLP) registers 210, and row parity (ROWP) registers 212. The bit position for the 32-bit registers is indicated in the top row 202. It is noted that different and/or additional registers could also be used while still taking advantage of the MCPC techniques described herein.

The control and status register (CSR) 204 includes a field that includes the syndrome state (SYNDST) 180 for the data region 134, a bit (B) 222 that indicates whether the MDPC 110 is busy (e.g., 1-busy, 0-idle or disabled), and a field that includes the operational mode (OPMODE) 170 for the MDPC 110. In addition, bit (E45) 224 can be used to enable automatic hardware transition from OPMODE4 to OPMODE5 (e.g., 0-disabled, 1-enabled); bit (E34) 226 can be used to enable automatic hardware transition from OPMODE3 to OPMODE4 (e.g., 0-disabled, 1-enabled); and bit (E23) 228 can be used to enable automatic hardware transition from OPMODE2 to OPMODE3 (e.g., 0-disabled, 1-enabled). If these bits are not set to enable automatic transition, then writes to the OPMODE field within the CSR 204 through the system interconnect bus 104 can be used to make these transitions. Other non-used fields and bit positions can be reserved (RES) and/or set to a fixed value (e.g., logic 0).

For one embodiment, the syndrome state (SYNDST) 180 is stored in a four-bit field that provides the current error syndrome state for the data region 134 checked by the MDPC 110. For one example embodiment, the MSB (most-significant-bit) can represent whether an error has been detected (e.g., 1-errors, 0-no errors). The MSB-1 can represent whether detected errors are uncorrectable (e.g., 1-uncorrectable, 0-correctable). The MSB-2 can represent whether there were no errors detected in the row parity bits (e.g., 1-no errors, 0-errors). Finally, the least-significant-bit can represent whether there were no errors detected in the column parity bits (e.g., 1-no errors, 0-errors). The following TABLE 1 provides example values and related descriptions for five different syndrome states that can be used and defined by the MDPC 110 for the four-bit syndrome state (SYNDST) 180.

TABLE 1

EXAMPLE 4-BIT SYNDROME STATES

| SYNDROME STATE | VALUE (binary) | DESCRIPTION |
|---|---|---|
| SD1 | 0011 | No error detected. |
| SD2 | 1000 | Error(s) in both row parity bits and column parity bits that is correctable. |
| SD3 | 1100 | Error(s) in both row parity bits and column parity bits that is uncorrectable. |
| SD4 | 1101 | Error(s) detected in row parity bits only and are uncorrectable. |
| SD5 | 1110 | Error(s) detected in column parity bits only and are uncorrectable. |

The operational mode (OPMODE) 170 is stored in a separate field and is used to determine the current mode of operation for the MDPC 110. For one embodiment, this field is a 3-bit field that identifies the current mode of operation. The following TABLE 2 provides example values and related descriptions for different modes of operation that can be used for the MDPC 110.

TABLE 2

EXAMPLE 3-BIT OPERATIONAL MODES

| Operational Mode | VALUE (binary) | DESCRIPTION |
|---|---|---|
| OPMODE0 | 000 | Disabled |
| OPMODE1 | 001 | Software reset (CSR, COLP, ROWP registers are cleared) |
| OPMODE2 | 010 | Clear parity registers (COLP, ROWP) to initialize stored values (e.g., set to 0) |
| OPMODE3 | 011 | Read data and accumulate parity bits in parity registers (COLP, ROWP) using accesses to data region of interest (e.g., sequential accesses) based upon start/end addresses as well as MNUM, if enabled. |
| OPMODE4 | 100 | Read expected COLP bits from stored data and determine error syndrome bits in column parity (COLP) registers (e.g., XOR operation) |
| OPMODE5 | 101 | Read expected ROWP bits from stored data and determine error syndrome bits in row parity (ROWP) registers (e.g., XOR operation) |
| OPMODE6 | 110 | Reserved |
| OPMODE7 | 111 | Real-time data correction mode based upon start/end addresses and MNUM, if enabled, where final syndrome state (SYNDST) indicates correctable error(s) |

For one embodiment, the start address field 232 in the start address register (SAR) 206 and the end address field 234 in the end address register (EAR) 208 are 22-bit fields that identify start and end addresses for the data region 134 within the external memory 130. For example, the start and end address fields 232/234 can represent the most significant 22 bits of 32-bit byte addresses for the data region 134 (e.g., start address 232 represents a 0-modulo-1024 byte base address and end address 234 represents a 1023-modulo-1024 byte address). For one embodiment, bit 0 in the end address register (EAR) 208 is used as a valid field (V) 240 that indicates if the data region 134 is valid (e.g., 0-invalid, 1-valid).

In addition, for one further embodiment, bit 236 in the start address register (SAR) 206 is a master number enable field (M) that is used to identify whether a requesting master device on the system interconnect bus 104, such as one of the processors 115, is tracked in addition to start/end addresses (e.g., 1-tracked, 0-not tracked). If tracked, then field 238 within the start address register (SAR) 206 can be used to store a master number (MNUM) for the master device for which the MDPC system 101 is used during operation to provide parity accumulation and on-the-fly data correction as described herein. In one embodiment, this MNUM field 238 is 6-bits that can therefore be used to select among 64 different master devices.

For one additional embodiment, the column parity registers 210 can include thirty-two (32) different 32-bit registers (COLP[00-31]) that together provide 1024 column parity bits with each bit being effectively associated with one column in a 1024-bit by 1024-bit multi-dimensional (MD) array. The row parity registers 212 can include thirty-two (32) different 32-bit registers (ROWP[00-31]) that together provide 1024 parity bits with each bit being effectively associated with one row in the 1024-bit by 1024-bit multi-dimensional (MD) array. It is noted that odd parity or even parity can be used for the parity bits. Odd parity sets the parity bit to "0" if the there is an odd number of 1s within the data and sets the parity bit to a "1" if there are an even number of 1s within the data. Even parity sets the parity bit to "1" if the there is an odd number of 1s within the data and sets the parity bit to a "0" if there are an even number of 1s within the data. In one embodiment, even parity is used for the parity bits in the column and row parity registers 210/212.

As described herein, the MDPC system 101 uses the column parity registers 210 and row parity registers 212 to store parity bits generated and accumulated for the data region 134. The MDPC system 101 also uses these parity registers 210/212 to store resulting error syndrome bits after comparing the generated accumulated parity bits to the expected parity bits 120 (e.g., using XOR operations). These error syndrome bits represent identified comparison errors where accumulated parity bits and expected parity bits do not match and are then used by the MDPC system 101 to determine the syndrome state 180 that is stored in the control register 204, for example, by counting the number of row error and column errors, as described above.

Figure 2B:
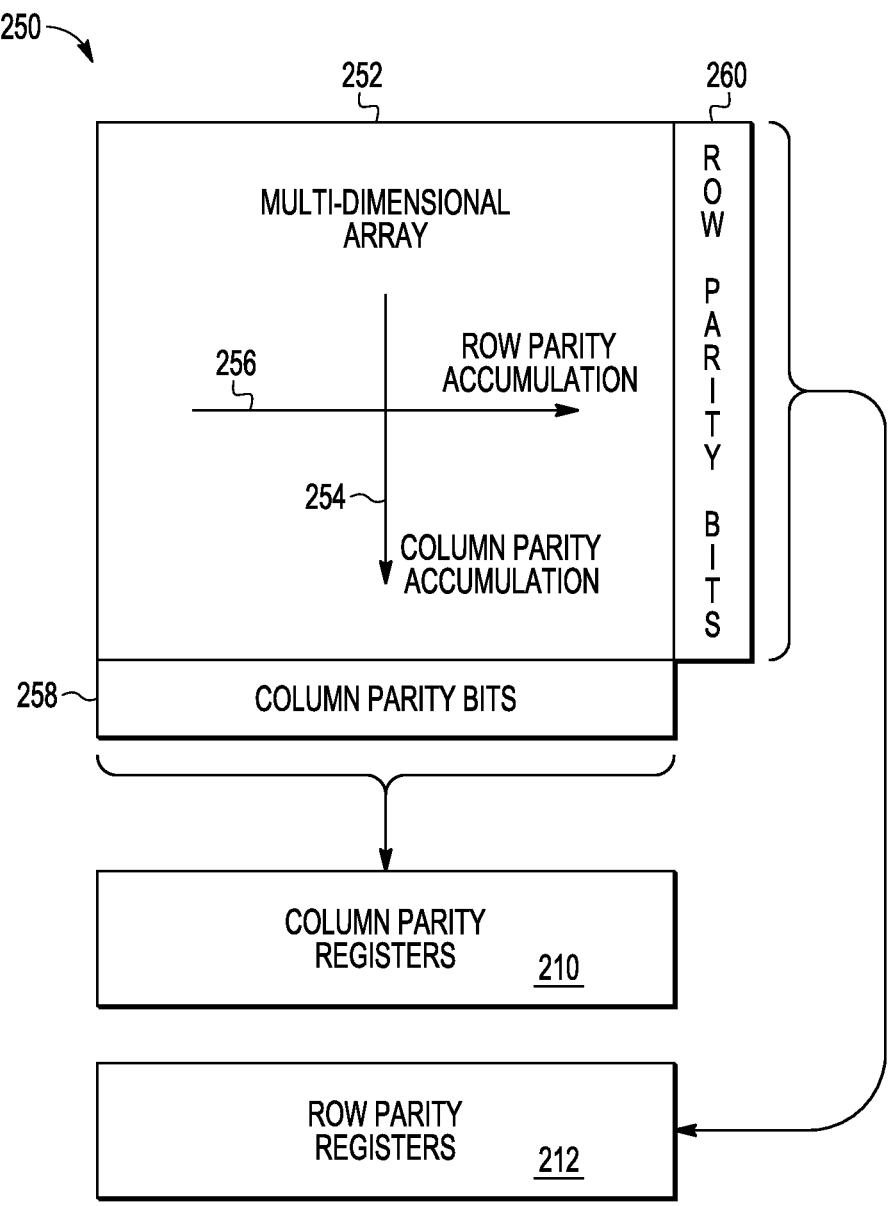
FIG. 2B is a block diagram of an example embodiment showing the correlation of column/row parity registers to accumulated column/row parity bits for an effective two-dimensional array.

FIG. 2B is a block diagram of an example embodiment 250 showing the correlation of the column/row parity registers 210/212 to an effective multi-dimensional array 252 having two dimensions. The column parity registers 210 effectively provide the columns within the two-dimensional array 252 and also provide the column parity bits 258 through column parity accumulation 254 described further below. The row parity registers 212 effectively provide the rows within the two-dimensional array 252 and also provide the row parity bits 260 through row parity accumulation 256 described further below.

Figure 3A:
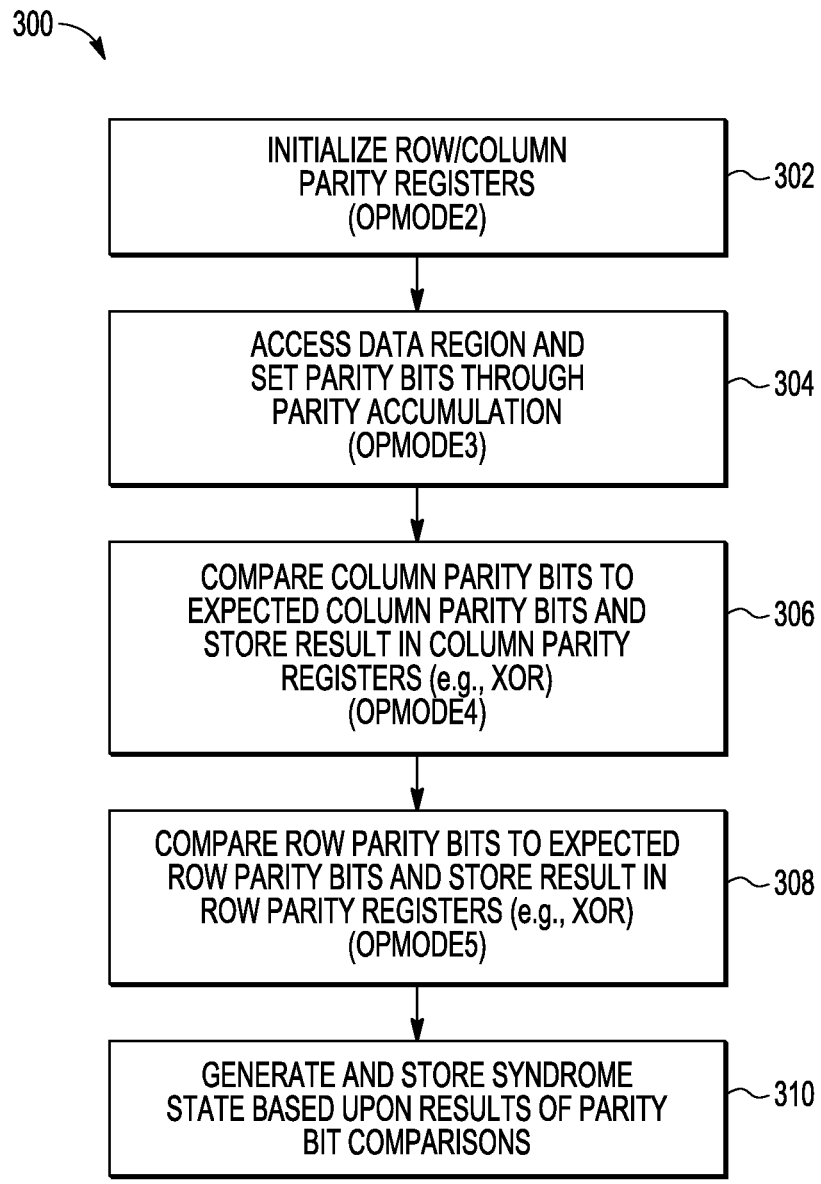
FIG. 3A is a process flow diagram of an example embodiment for operational modes of an MDPC conducting a two-dimensional parity check of a data region.

FIG. 3A is a process flow diagram of an example embodiment 300 for operational modes of the MDPC system 101 to conduct a parity check of the data region 134 using the operational modes described above. In block 302 when set to OPMODE2, the MDPC system 101 initializes the column and row parity registers 210/212, for example, to zero values. In block 304 when set to OPMODE3, the MDPC 110 accesses data segments (e.g., 8 byte or 64-bit segments) from data region 134 through the memory controller 106 and generates parity bits within the column and row parity registers 210/212 through parity accumulation. These accesses can be, for example, non-overlapping sequential accesses to the data region 134. In block 306 when set to OPMODE4, the MDPC system 101 compares each column parity bit in the column parity registers 210 to a corresponding expected column parity bit within the expected parity bits 120 and stores the resulting error syndrome bit back into the corresponding bit location within the column parity registers 210. For example, where an XOR operation is used for the inequality comparison, the resulting error syndrome bit is a "0" if the two corresponding generated/expected column parity bits match (e.g., both 1s or both 0s) and is a "1" if the two corresponding generated/expected column parity bits do not match (e.g., one is a 1 and the other is a 0). In block 308 when set to OPMODE5, the MDPC system 101 compares each row parity bit in the row parity registers 212 to a corresponding expected row parity bit within the expected parity bits 120 and stores the resulting error syndrome bit back into the corresponding bit location within the row parity registers 212. For example, where an XOR operation is used for the inequality comparison, the resulting error syndrome bit is a "0" if the two corresponding generated/expected row parity bits match (e.g., both 1s or both 0s) and is a "1" if the two corresponding generated/expected row parity bits do not match (e.g., one is a 1 and the other is a 0). In block 310, the MDPC system 101 automatically generates the syndrome state (SYNDST) for the parity check based upon the results of the row/column parity bit comparisons and row/column syndrome bit counts as described below. The MDPC system 101 then stores the syndrome state (SYNDST) 180 within a field of the CSR 204.

For the parity accumulation in block 304, the MDPC system 101 keeps track of row/column parity by accumulating the data being read from the data region 134, for example, through sequential accesses to data within the data region 134. For example, assuming that 64 bits are read in each accessed data segment and the data region 134 occupies a 1024 bit by 1024 bit array, it takes 16 accesses to read an entire 1024-bit row. Once this occurs, the first bit in the row parity registers 210 can be set based upon whether even or odd parity is being used. In addition, these 1024 bits can be used to fill the 1024 bits of the column parity registers 210. The next 1024 bits determine the second bit in the row parity registers 212 and are also used to adjust the bits in the column parity registers 210. For example, where even parity is used, if a bit in the column parity registers 210 was a 0, it stays 0 if a 0 is received and becomes a 1 if a 1 is received. Where odd parity is used, if a bit in the column parity registers 210 was a 1, it stays 1 if a 0 is received and becomes a 0 if a 1 is received. As such, the parity bits can be effectively accumulated within the column/row parity registers 210/212 as the data from the data region 134 is accessed and read.

As indicated above, the syndrome state can be based upon counts of the error syndrome bits generated for the data region 134 from a comparison of the accumulated parity bits to the expected parity bits 120. The error syndrome bits, for example, can be generated using XOR logic operations and can be stored back into the column/row parity registers 210/212. These error syndrome bits can also be used to generate syndrome row and column counts that in turn determine the syndrome state. In particular, a count of the number of 1s within the column error syndrome bits can be used to generate a column count, and a count of the number of 1s within the row error syndrome bits can be used to generate a row count. The following TABLE 3 provides example syndrome states as determined by the row/column counts for error syndrome bits and using the syndrome states set forth above in TABLE 1.

TABLE 3

EXAMPLE 4-BIT SYNDROME STATE DETERMINATION

| | Column Count = 0 | Column Count = 1 | Column Count > 1 and even | Column Count > 1 and odd |
|---|---|---|---|---|
| Row Count = 0 | SD1 | SD5 | SD5 | SD5 |
| Row Count = 1 | SD4 | SD2 | SD3 | SD2 |
| Row Count > 1 and even | SD4 | SD3 | SD3 | SD3 |
| Row Count > 1 and odd | SD4 | SD2 | SD3 | SD3 |

As indicated above, syndrome states SD1 and SD2 represent error states where there are no errors and where there are correctable errors, respectively. If the data region 134 is determined to have a correctable syndrome state (SD2), the MDPC system 101 can be placed in its data correction operational mode (e.g., OPMODE7). If the operational mode for the MDPC system 101 is enabled to provide real-time data correction (e.g., OPMODE7), then the MDPC system 101 operates in the normal operation mode for the processing system integrated circuit 102 to provide real-time error correction for random accesses to data within the memory data region 134 as defined by the start/end address registers 206/208. If master device checking is also enabled, then the master identifier for the requesting device must also match the master device field (MNUM) 238 before error correction will be provided by the MDPC system 101. During this data correction mode, the MDPC system 101 corrects the corrupted memory bits to provide corrected data when the data region 134 is randomly accessed. For one embodiment, the MDPC system 101 performs data inversions to correct the data using the row and column error syndrome bits within the registers 210/212 to determine which bits are to be inverted.

Assuming a 1024×1024 bit array mapping of the data region, it is noted that a 20-bit bit address can be used to identify particular bit locations for the error syndrome bits within the column and row parity registers 210/212 where 32 four byte registers (32 bits) are used for each. In particular, the 5 most significant bits can be used to select one of the 32 row parity registers within the row parity registers 212, and the next 5 most significant can be used to select a bit position within the 32 bits for that selected row parity register. The next 5 most significant bits can be used to select one of the 32 column parity registers within the column parity registers 210, and the final 5 most significant can be used to select a bit position within the 32 bits for that selected column parity register.

Figure 3B:
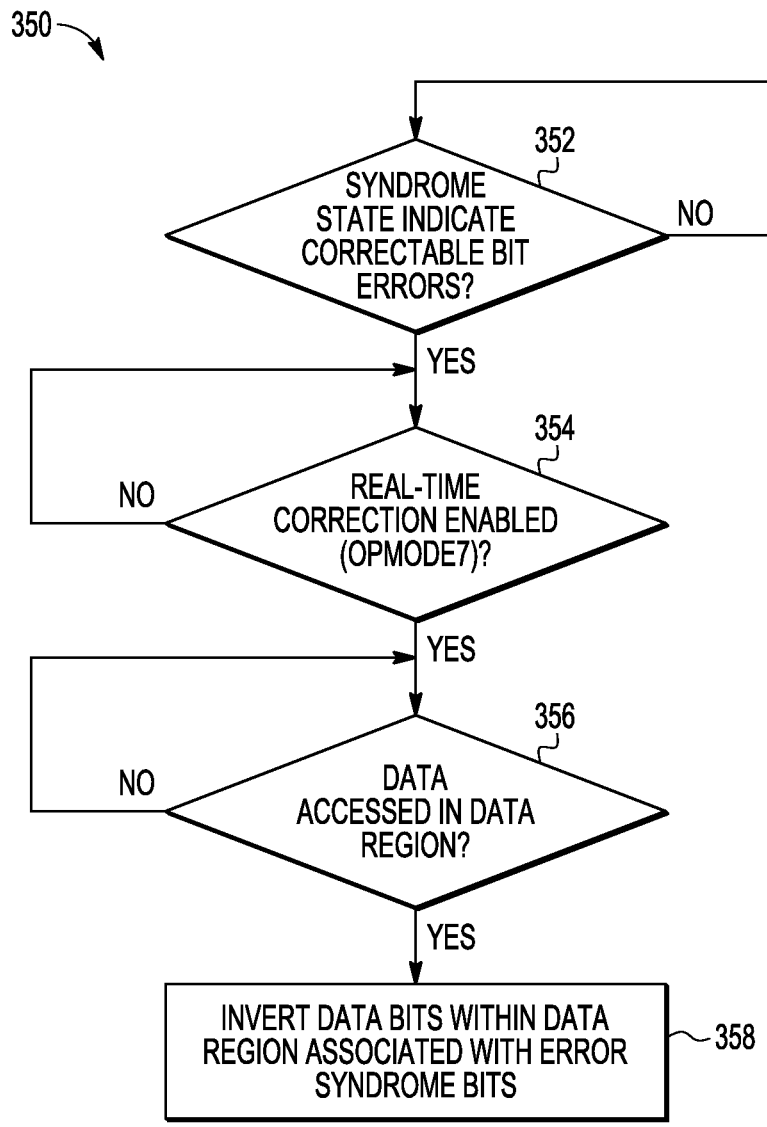
FIG. 3B is a process flow diagram of an example embodiment for operation of the MDPC to perform real-time error correction during additional operations of the processing system integrated circuit.

FIG. 3B is a process flow diagram of an example embodiment 350 for operation of the MDPC system 101 to perform real-time error correction during normal operations of the processing system integrated circuit 102. In block 352, a determination is made whether the syndrome state indicates that correctable bit errors exist. If "NO," then flow passes back to block 352. If "YES," then flow passes to block 354 where a determination is made whether the real-time error correction mode of operation has been enabled for the MDPC system 101, for example, where the operational mode (OPMODE) 170 is set to OPMODE7 for the example embodiment described above. If "NO," then flow passes back to block 354. If "YES," then flow passes to block 356 where a determination is made whether newly accessed data is within the data region 134. For example, the error correction mode can be initiated when a subsequent access to the external memory 130 uses an address within an address range defined by the start address and the end address stored in the start/end address registers 206/208. If "NO," then flow passes back to determination block 356 until data within the data region 134 is accessed. If the determination in block 356 is "YES," then flow passes to block 358 where the MDPC system 101 uses the error syndrome bits to invert data bits within the data region 134 that are associated with the specific bit locations for the error syndrome bits, providing the corrected data.

Figure 4:
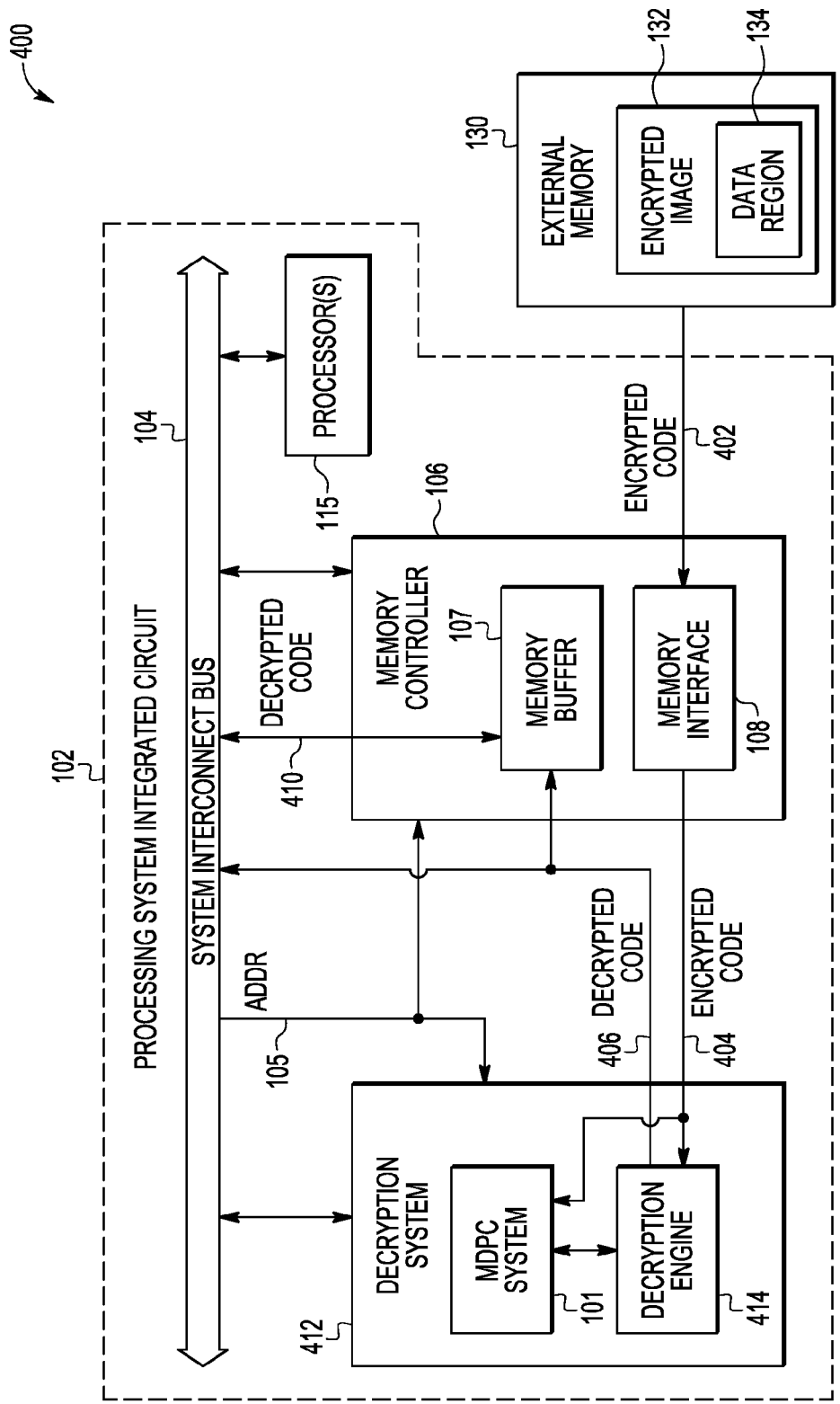
FIG. 4 is a block diagram of an example embodiment where an MDPC system is used to provide real-time correction for a processing system integrated circuit that is decrypting an encrypted software image from an external memory.

FIG. 4 is a block diagram of an example embodiment 400 where the MDPC system 101 is used to provide real-time correction for a processing system integrated circuit 102 that is decrypting an encrypted software image 132 from an external memory 130. In operation, the memory controller 106 accesses encrypted code 402 from the encrypted software image 132 and then provides encrypted code 404 to the decryption engine 414 or the MDPC system 101, when operating in real-time correction mode, through memory interface 108. Decrypted code 406 is provided back to the memory buffer 107 and/or directly to the system interconnect bus 104. Decrypted code 410 from the memory buffer system 108 can also be provided to the system interconnect bus 104. If the memory controller 106 and decryption system 412 access and decrypt data using a random address 105 that falls within an address range defined by the start address and the end address stored in the start/end address registers 206/208, then the MDPC system 101 can be used to provide on-the-fly correction of the encrypted data. In particular, if the syndrome state indicates that correctable bit errors exist within the data region 134 (e.g., syndrome mode SD2) and the data correction operation mode is selected (e.g., OPMODE7), then the MDPC system 101 is used to correct the correctable bits based upon the error syndrome bits identified during the parity check. For example, where bits within the newly accessed data within the data region 134 correspond to syndrome error bits that identify comparison errors, these bits can be inverted to provide real-time correction. Further, after the corrected encrypted data is generated by MDPC system 101, it is sent to decryption engine 414 where it is decrypted, producing decrypted code 406.

As described herein, a variety of embodiments can be implemented and different features and variations can be implemented, as desired.

For one embodiment, a system to check parity within an integrated circuit is disclosed including a control register configured to store a syndrome state and a parity checker configured to accumulate multi-dimensional parity bits generated for data segments accessed from a data region within an external memory and to compare accumulated multi-dimensional parity bits to expected multi-dimensional parity bits to generate multi-dimensional error syndrome bits representing identified comparison errors. The parity checker is further configured to determine a syndrome state based upon the multi-dimensional error syndrome bits and to store the syndrome state within the control register, the syndrome state being one of multiple possible syndrome states including a first syndrome state indicating detection of no errors, a second syndrome state indicating detection of correctable errors, and a third syndrome state indicating detection of uncorrectable errors. The control register and the parity checker are integrated within an integrated circuit.

In additional embodiments, the system also includes a data storage system within the integrated circuit configured to store the expected multi-dimensional parity bits. In further embodiments, the parity checker includes XOR logic configured to receive the accumulated multi-dimensional parity bits and the expected multi-dimensional parity bits and to output the multi-dimensional error syndrome bits.

In additional embodiments, the parity checker is configured to operate in different modes based upon different values stored in an operational mode field of the control register within the integrated circuit. In further embodiments, the data region is defined based upon a start address and an end address stored within one or more address fields of the control register within the integrated circuit. In still further embodiments, an error correction mode of operation for the parity checker is configured to be enabled based upon a value stored within the operational mode field of the control register, and the parity checker is configured to subsequently correct data accessed within an address range defined by the start address and the end address.

In additional embodiments, the expected multi-dimensional parity bits are two-dimensional parity bits including expected column parity bits and expected row parity bits; the accumulated multi-dimensional parity bits are two-dimensional parity bits including column parity bits and row parity bits; and the multi-dimensional error syndrome bits are two-dimensional parity bits including column error syndrome bits and row error syndrome bits. In further embodiments, the parity checker is configured to accumulate column and row parity data during data accesses to the data region to generate the column parity bits and the row parity bits. In still further embodiments, the parity checker is configured to store the column parity bits within a plurality of column parity registers within the integrated circuit and to store the row parity bits within a plurality of row parity registers within the integrated circuit. In additional embodiments, the parity checker is configured to store the row error syndrome bits in the row parity registers and to store the column error syndrome bits in the column parity registers.

For one embodiment, a method within an integrated circuit to check parity of an external data region is disclosed including accessing data segments within an external data region within an external memory, accumulating multi-dimensional parity bits generated for the data segments during the accessing, subsequently comparing the accumulated multi-dimensional parity bits to expected multi-dimensional parity bits to generate multi-dimensional error syndrome bits representing errors identified from the comparing, determining a syndrome state based upon the multi-dimensional error syndrome bits, and storing the syndrome state within a control register. The syndrome state is one of multiple possible syndrome states including a first syndrome indicating detection of no errors, a second syndrome indicating detection of correctable errors, and a third syndrome indicating detection of uncorrectable errors. Further, the accessing, generating, comparing, determining, and storing are performed within an integrated circuit.

In additional embodiments, the method includes using XOR logic for the comparing. In further embodiments, the method includes using different values stored in an operational mode field of the control register within the integrated circuit to initiate the generating, comparing, and determining.

In additional embodiments, the method further includes determining the external data region based upon a start address and an end address stored within one or more address fields of the control register within the integrated circuit. In further embodiments, the method includes using a value stored in the operational mode field to enable an error correction mode of operation and, once enabled, initiating the error correction mode of operation when a subsequent random access to the external memory uses an address within an address range defined by the start address and the end address. In still further embodiments, the method includes inverting data bits accessed from the data region based upon the error syndrome bits to provide error correction within the error correction mode of operation.

In additional embodiments, the expected multi-dimensional parity bits are two-dimensional parity bits including expected column parity bits and expected row parity bits; the accumulated multi-dimensional parity bits are two-dimensional parity bits including column parity bits and row parity bits; and the multi-dimensional error syndrome bits are two-dimensional parity bits including column error syndrome bits and row error syndrome bits. In further embodiments, the method includes generating the column parity bits and the row parity bits by accumulating column parity bits and row parity bits during the accessing. In still further embodiments, the method includes storing the column parity bits within a plurality of column parity registers within the integrated circuit and storing the row parity bits within a plurality of row parity registers within the integrated circuit. In additional embodiments, the method includes storing the row error syndrome bits in the row parity registers and storing the column error syndrome bits in the column parity registers.

It is further noted that the functional blocks, devices, and/or circuitry described herein can be implemented using hardware, software, or a combination of hardware and software. In addition, one or more processing devices (e.g., central processing units (CPUs), controllers, microcontrollers, microprocessors, hardware accelerators, processors, programmable integrated circuitry, FPGAs (field programmable gate arrays), ASICs (application specific integrated circuits), and/or other processing devices) executing software and/or firmware instructions can be used to implement the disclosed embodiments. It is further understood that one or more of the operations, tasks, functions, or methodologies described herein can be implemented, for example, as software, firmware and/or other program instructions that are embodied in one or more non-transitory tangible computer-readable mediums (e.g., data storage devices, flash memory, random access memory, read only memory, programmable memory devices, reprogrammable storage devices, hard drives, floppy disks, DVDs, CD-ROMs, and/or any other tangible data storage medium) and that are executed by one or more processing devices (e.g., central processing units (CPUs), controllers, microcontrollers, microprocessors, hardware accelerators, processors, programmable integrated circuitry, FPGAs (field programmable gate arrays), ASICs (application specific integrated circuits), and/or other processing devices) to perform the operations, tasks, functions, or methodologies described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. An integrated circuit, comprising:
   a memory controller having a memory interface to an external memory;
   a data storage system configured to store expected multi-dimensional parity bits for a data region accessed from the external memory;
   a control register configured to store a syndrome state, the syndrome state being one of multiple possible syndrome states comprising a first syndrome state indicating detection of no errors, a second syndrome state indicating detection of correctable errors, and a third syndrome state indicating detection of uncorrectable errors;
   a parity checker having data segments accessed from the data region within the external memory as an input and having corrected data as an output; and
   at least one additional component coupled to the parity checker and having the corrected data as an input;
   wherein the parity checker is further configured to accumulate multi-dimensional parity bits generated from the data segments and to compare the accumulated multi-dimensional parity bits to the expected multi-dimensional parity bits to generate multi-dimensional error syndrome bits representing identified comparison errors;
   wherein the parity checker is further configured to accumulate column parity bits and to separately accumulate row parity bits during accesses to the data region to accumulate the multi-dimensional parity bits;
   wherein the parity checker is further configured to determine the syndrome state based upon the multi-dimensional error syndrome bits and to store the syndrome state within the control register; and
   wherein the parity checker is further configured in an error correction mode of operation to use the stored syndrome state to determine if correctable errors are present, to correct the correctable errors if present, and to output the corrected data.

2. The system of claim 1, wherein the parity checker comprises XOR logic configured to receive the accumulated multi-dimensional parity bits and the expected multi-dimensional parity bits and to output the multi-dimensional error syndrome bits.

3. The system of claim 1, wherein the parity checker is configured to operate in different modes based upon different values stored in an operational mode field of the control register within the integrated circuit.

4. The system of claim 3, wherein the data region is defined based upon a start address and an end address stored within one or more address fields of the control register within the integrated circuit.

5. The system of claim 4, wherein the error correction mode of operation for the parity checker is configured to be enabled based upon a value stored within the operational mode field of the control register, and wherein the parity checker is configured to subsequently correct data accessed within an address range defined by the start address and the end address.

6. The system of claim 1, wherein the expected multi-dimensional parity bits are two-dimensional parity bits including expected column parity bits and expected row parity bits, wherein the accumulated multi-dimensional parity bits are two-dimensional parity bits including the column parity bits and the row parity bits, and wherein the multi-dimensional error syndrome bits are two-dimensional parity bits including column error syndrome bits and row error syndrome bits.

7. The system of claim 1, wherein the parity checker is configured to store the column parity bits within a plurality of column parity registers within the integrated circuit and to store the row parity bits within a plurality of row parity registers within the integrated circuit.

8. The system of claim 7, wherein the parity checker is configured to store the row error syndrome bits in the row parity registers and to store the column error syndrome bits in the column parity registers.

9. A method performed within an integrated circuit to correct data accessed from an external data region, comprising:
    accessing, with a memory controller having a memory interface, data segments within the external data region within an external memory coupled to the integrated circuit;
    accumulating multi-dimensional parity bits for the data segments during the accessing by accumulating column parity bits and separately accumulating row parity bits during the accessing to generate column parity bits and row parity bits;
    subsequently comparing the accumulated multi-dimensional parity bits to expected multi-dimensional parity bits stored in a data storage system within the integrated circuit to generate multi-dimensional error syndrome bits representing errors identified from the comparing;
    determining a syndrome state based upon the multi-dimensional error syndrome bits, the syndrome state being one of multiple possible syndrome states comprising a first syndrome indicating detection of no errors, a second syndrome indicating detection of correctable errors, and a third syndrome indicating detection of uncorrectable errors;
    storing the syndrome state within a control register; and
    in an error correction mode of operation, using the stored syndrome state to determine if correctable errors are present and correcting the correctable errors if present to generate corrected data; and
    outputting the corrected data to at least one additional component within the integrated circuit.

10. The method of claim 9, further comprising using XOR logic for the comparing.

11. The method of claim 9, further comprising using different values stored in an operational mode field of the control register within the integrated circuit to initiate the generating, comparing, and determining.

12. The method of claim 11, further comprising determining the external data region based upon a start address and an end address stored within one or more address fields of the control register within the integrated circuit.

13. The method of claim 12, further comprising using a value stored in the operational mode field to enable the error correction mode of operation and, once enabled, initiating the error correction mode of operation when a subsequent random access to the external memory uses an address within an address range defined by the start address and the end address.

14. The method of claim 13, further comprising inverting data bits accessed from the data region based upon the error syndrome bits to provide error correction within the error correction mode of operation.

15. The method of claim 9, wherein the expected multi-dimensional parity bits are two-dimensional parity bits including expected column parity bits and expected row parity bits, wherein the accumulated multi-dimensional parity bits are two-dimensional parity bits including the column parity bits and the row parity bits, and wherein the multi-dimensional error syndrome bits are two-dimensional parity bits including column error syndrome bits and row error syndrome bits.

16. The method of claim 9, further comprising storing the column parity bits within a plurality of column parity registers within the integrated circuit and storing the row parity bits within a plurality of row parity registers within the integrated circuit.

17. The method of claim 16, further comprising storing the row error syndrome bits in the row parity registers and storing the column error syndrome bits in the column parity registers.

* * * * *